(12) United States Patent
Gharpure et al.

(10) Patent No.: US 10,483,868 B2
(45) Date of Patent: Nov. 19, 2019

(54) POWER SUPPLY UNIT WITH RE-RUSH CURRENT LIMITING

(71) Applicant: DELL PRODUCTS, LP, Round Rock, TX (US)

(72) Inventors: Padmanabh R Gharpure, Round Rock, TX (US); Ashish Razdan, Round Rock, TX (US); Mehran Mirjafari, Austin, TX (US); Lei Wang, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/435,047

(22) Filed: Feb. 16, 2017

(65) Prior Publication Data

US 2018/0234025 A1  Aug. 16, 2018

(51) Int. Cl.
*H02M 7/06* (2006.01)
*H02M 1/32* (2007.01)
*H02M 3/04* (2006.01)
*H02M 1/42* (2007.01)
*G01R 19/25* (2006.01)
*H02M 1/00* (2006.01)

(52) U.S. Cl.
CPC .......... *H02M 7/06* (2013.01); *G01R 19/2513* (2013.01); *H02M 1/32* (2013.01); *H02M 1/42* (2013.01); *H02M 3/04* (2013.01); *H02M 2001/007* (2013.01); *Y02B 70/12* (2013.01)

(58) Field of Classification Search
CPC ............ H02M 7/06; H02M 1/32; H02M 1/42; H02M 3/04; H02M 1/36; H02M 2001/0045; H02M 7/2176; H02M 2001/007; G01R 19/2513; G06F 1/263; Y02B 70/12
See application file for complete search history.

(56) References Cited

U.S. PATENT DOCUMENTS

| | | | |
|---|---|---|---|
| 5,909,364 A * | 6/1999 | Rivet | H02M 1/4208 323/299 |
| 6,445,165 B1 * | 9/2002 | Malik | H02H 9/001 323/222 |
| 6,556,062 B1 * | 4/2003 | Wallace | H03K 4/00 327/132 |
| 9,281,758 B1 | 3/2016 | Wang et al. | |
| 9,513,681 B2 | 12/2016 | Wang et al. | |
| 9,548,730 B1 * | 1/2017 | Helm | H03K 17/04123 |
| 2002/0131298 A1 * | 9/2002 | Barnes | G11C 7/065 365/181 |

(Continued)

*Primary Examiner* — Nguyen Tran
*Assistant Examiner* — Demetries A Gibson
(74) *Attorney, Agent, or Firm* — Larson Newman, LLP

(57) ABSTRACT

A power supply unit includes a rectifying module to rectify an alternating current (AC) voltage, a first bulk capacitor to receive the rectified AC voltage from the rectifying module, a first transistor coupled in series with the first bulk capacitor, an AC input monitoring circuit, and a current source. The AC input monitoring circuit holds the first transistor in an OFF state in response to a detection of an AC voltage dropout. The current source adopts an adaptive gate voltage to control the first transistor in response to a detection of the AC voltage being re-applied, and turns on the first transistor based on the adaptive gate voltage to limit a re-rush current within the power supply unit after the AC voltage is re-applied.

20 Claims, 6 Drawing Sheets

(56) References Cited

U.S. PATENT DOCUMENTS

| | | | |
|---|---|---|---|
| 2006/0098361 A1* | 5/2006 | Potter | H02H 1/0015 361/42 |
| 2011/0006748 A1* | 1/2011 | Jang | H02M 1/36 323/299 |
| 2011/0273099 A1* | 11/2011 | Liang | H05B 33/0809 315/186 |
| 2014/0085947 A1* | 3/2014 | Capilla | H02M 1/4225 363/52 |
| 2016/0126859 A1* | 5/2016 | Wang | G06F 1/263 713/300 |
| 2016/0154386 A1* | 6/2016 | Takayama | G05B 19/406 307/328 |
| 2016/0181931 A1* | 6/2016 | Song | H02M 1/15 363/21.15 |

* cited by examiner

POWER SUPPLY UNIT WITH RE-RUSH CURRENT LIMITING

FIELD OF THE DISCLOSURE

The present disclosure generally relates to information handling systems, and more particularly relates to a power supply unit with re-rush current limiting.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems.

SUMMARY

A power supply unit includes a rectifying module to rectify an alternating current (AC) voltage, a first bulk capacitor to receive the rectified AC voltage from the rectifying module, a first transistor coupled in series with the first bulk capacitor, an AC input monitoring circuit, and a current source. The AC input monitoring circuit may hold the first transistor in an OFF state in response to a detection of an AC voltage dropout. The current source may adopt an adaptive gate voltage to control the first transistor in response to a detection of the AC voltage being re-applied, and may turn on the first transistor based on the adaptive gate voltage to limit a re-rush current within the power supply unit after the AC voltage is re-applied.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
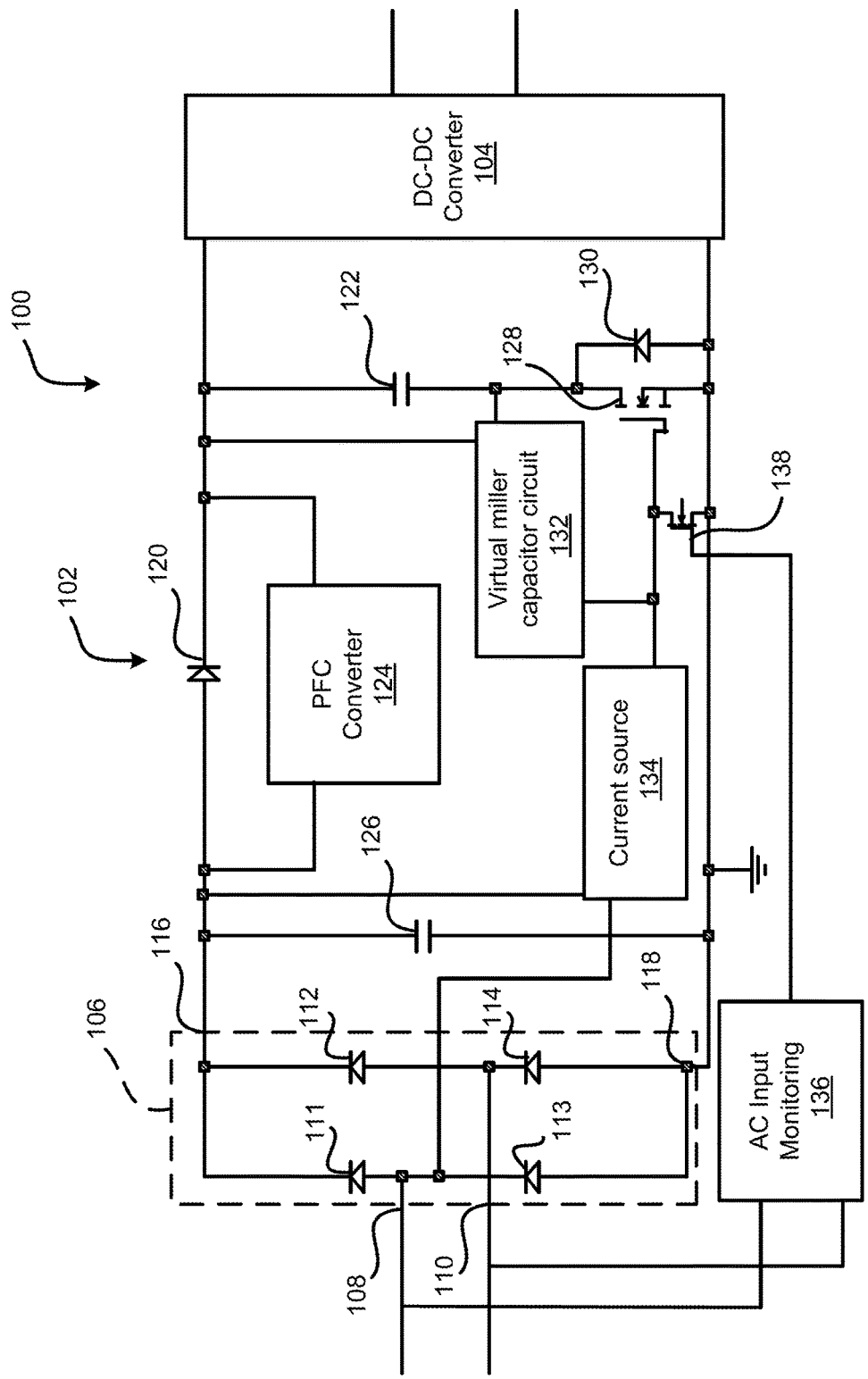
FIG. 1 is a schematic diagram of an embodiment of a power supply unit to be used in an information handling system according to an embodiment of the present disclosure.

FIG. 1 illustrates a power supply unit 100 for use in an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The power supply unit 100 includes an inrush current limiting circuit 102 and a direct current-to-direct current (DC/DC) converter 104. The inrush current limiting circuit 102 includes a rectifier module 106 configured to rectify an input voltage, such as from an alternating current (AC) power source. In some examples, the AC power source may couple to the rectifier module 106 by way of first and second input terminals 108 and 110. The rectifier module 106 includes diodes 111, 112, 113, and 114 (diodes 111-114). In various examples, the diodes 111-114 form a diode rectifier bridge that is configured to receive an AC signal and provide a rectified signal by way of first and second output terminals 116 and 118. In an embodiment, the second output terminal 118 may be coupled to a ground terminal. In an embodiment, the diodes 111-114 may include power diodes suitable for switching power supplies, such as a power diode selected from one or more of an MUR105 diode, an MUR110 diode, an MUR115 diode, an MUR120 diode, an MUR130 diode, an MUR140 diode, an MUR160 diode, and an MUR180 diode. While a few examples of models of power diodes that may be used to implement the rectifier module 106, these examples are not meant to be limiting in any way, and those skilled in the art will understand that other models of power diodes may equally be used without departing from the scope of the present disclosure.

The inrush current limiting circuit 102 includes a diode 120 connected in series with a capacitor 122, and a power factor correction converter 124. The diode 120 includes a first terminal coupled to the output terminal 116, and a second terminal. The capacitor 122 includes a first terminal coupled to the second terminal of the diode 120, and a second terminal. The power factor correction converter 124 includes a first terminal coupled to the first terminal of the diode 120, and a second terminal coupled to the second terminal of the diode 120.

In an embodiment, the capacitor 122 may be a bulk output capacitor having a rating of around 450 μF/450V. In an embodiment, the capacitor 122 may be an electrolytic capacitor, a ceramic capacitor, a film capacitor, or other type of capacitor as known in the art. In an embodiment, a capacitor 126 may be connected across the output terminals 116 and 118 of the rectifier module 106, such that a first terminal of the capacitor 126 is coupled to the first output terminal 116, and a second terminal is coupled to the second output terminal 118, which in turn is coupled to the ground terminal. In an embodiment, the capacitor 126 may be a high-frequency (HF) capacitor which acts as a HF filter. In an embodiment, the capacitor 126 may be a ceramic capacitor, a film capacitor, or other type of capacitor as known in the art. In some examples, the capacitor 126 may have a value of about 100 nF.

The transistor 128 includes first and second current electrodes, and a gate electrode. The first current electrode of the transistor 128 is coupled to the second terminal of the capacitor 122, and the second current electrode of the transistor 128 is coupled to the output terminal 118 of the rectifier module 106, which in turn is coupled to the ground terminal. In an embodiment, transistor 128 can be an N-channel metal-oxide semiconductor field-effect transistor (MOSFET), where the first current electrode is a drain electrode and the second current electrode is a source electrode. In an embodiment, transistor 128 can be a 500V N-channel power MOSFET. However, other suitable power MOSFETs having other ratings may also be used for the transistor 128. In an embodiment, transistor 128 may be a power transistor packaged in one of a variety of discrete SMT packages, such as SOT-23, SC-70, SOT-66, SOT-89, SOT-143, SOT-223, TSOT-23, or the like. While a few examples of packages have been given, these examples are not meant to be limiting in any way, and those skilled in the art will understand that other packages and package types may equally be used without departing from the scope of the present disclosure. The diode 130 includes a first terminal coupled to the first current electrode of the transistor 128, and a second terminal coupled to the second current electrode of the transistor 128, which in turn is coupled to the ground terminal.

The virtual Miller capacitor circuitry 132 provides an additional Miller effect between the drain and gate terminals of transistor 128. The current source 134 includes a first terminal coupled to output terminal 116, a second terminal coupled to AC line via the input terminal 108, and a third terminal coupled to the gate electrode of the transistor 128. Virtual miller capacitor circuitry 132 includes a first terminal coupled to the first terminal of the capacitor 122, a second terminal coupled to the second terminal of the capacitor 122, and a third terminal coupled to the gate electrode of the transistor 128. One of ordinary skill in the art would recognize that the virtual miller capacitor circuitry 132 and the current source 134 can be implemented in different manners, such as described in U.S. Pat. No. 9,513,681 which is incorporated herein by reference.

In an embodiment, losses in transistor 128 can be minimal, as it is not in series with the main power path of the power supply 100. In an embodiment, the inrush current through transistor 128 can be set at a constant value by making use of virtual miller capacitance 132. The virtual miller capacitive circuit 132 includes preferably generates a 'negative' bulk capacitor voltage, thus emulating the otherwise inherent MOSFET Miller capacitance present in DC applications. For example, in some cases, the output of the virtual miller capacitor circuit 132 may be set just below a supply voltage, such as 15 V.

Current source 134 may generate a preset current source, such as 2 mA, and may also sink current when a rectified AC voltage from the rectifier module 106 is lower than voltage of the capacitor 122, such as at zero crossings on the input voltage. For example, when the rectified AC voltage is lower than a DC bus voltage at the first terminal of the capacitor 122, the output of the current source 134 can be pulled low to sink current, such that current does not flow through that virtual miller capacitor path when there is no current flowing through the capacitor 122, therefore maintaining the integrity of the effect of virtual Miller capacitor 132. In an embodiment, the current source 134 may generate a source current larger than the sink current. The AC input monitoring circuit 136 can monitor the AC input voltage and control a state of transistor 128 via the transistor 138.

In operation, at beginning of a power on or reset event, there is no charge across capacitor 122 and the transistor 128 is held in an OFF state by the AC input monitoring circuit 136, so no current flows through capacitor 122 or transistor 128. In an embodiment, the AC input monitoring circuit 136 can hold the transistor 128 in the OFF state by activating the transistor 138, which in turn can pull the voltage level of the gate electrode to the ground terminal. Once the AC input monitoring circuit 136 releases the holding of transistor 128 in the OFF state by, for example, deactivating the transistor 138, then current source 134 can start to charge the gate electrode of the transistor 128, and once it reaches gate threshold, the transistor 128 can enter into the conduction region and current starts to flow through capacitor 122 and transistor 128.

The AC inrush current due to the power on event increases to a value which is proportional to the current provided by current source 134 and inversely proportional to the value of a capacitor in the virtual miller capacitor circuit 132. At a preset value, all current from current source 134 is diverted to the capacitor of the virtual miller capacitor circuit 132 and the gate electrode of the transistor 128 is not charged anymore. Thus, keeping transistor 128 operating in its plateau region. As a result, the inrush current is maintained at a pre-set level, such as 3.5 A, as long as the value of the DC bus is greater than the voltage across capacitor 122. When the AC input current goes lower, for example near zero crossing, the AC inrush current goes to zero.

The AC input monitoring circuit 136 also monitors the AC input voltage after the power supply 100 has completed the start-up phase. In an embodiment, the AC input monitoring circuit 136 can monitor the input terminals 108 and 110 to determine whether an AC dropout event, a ride-through period, brown-out event, complete loss of the AC input voltage, or other similar loss of AC input voltage has occurred. In an embodiment, the ride-through period is an extended length of time that the AC input voltage is at zero as compared to normal characteristics of the AC input voltage. In an embodiment, these AC voltage losses, such as AC dropout, are short enough in duration that the power supply unit 100 is not fully reset to an initial state, such that the capacitor 122 still has a voltage across its terminals.

If the AC input monitoring circuit 136 detects an AC dropout, such as a brown out event or the AC input voltage dropping to zero, the AC input monitoring circuit 136 can provide an OFF state signal to activate the transistor 138, which in turn pulls the gate electrode of the transistor 128 to zero to place the transistor 128 in an OFF state. The AC input monitoring circuit 136 can continue to monitor the AC input voltage. In response to the AC input voltage being re-applied to the input terminals 108 and 110, the AC input monitoring circuit 136 can provide an ON state signal to cause the transistor 138 to open, such that the current source 134 and the virtual miller capacitor circuit 132 can operate as described above to provide an adaptive gate voltage to the gate terminal of the transistor 128, which in turn limits a re-rush current in the power supply unit 100.

The DC-DC converter 104 includes a first terminal coupled first terminal of the capacitor 122, and a second terminal coupled to the second current electrode of the transistor 128, such that the DC-DC converter 104 is in parallel with capacitor 122 and transistor 128. The DC-DC converter 104 produces an output DC voltage, such as 12 V. This output DC voltage may then be used to power one or more electronic components or circuits within an information handling system, such as a CPU 602, a board management controller 680, or another component of the information handling system 600 described in FIG. 6 below. In some embodiments, the inrush current limiting circuit 102 may include other resistors, capacitors, diodes, inductors, relays, transistors, and/or other active or passive components as known in the art, without departing from the scope of the present disclosure.

Figure 2:
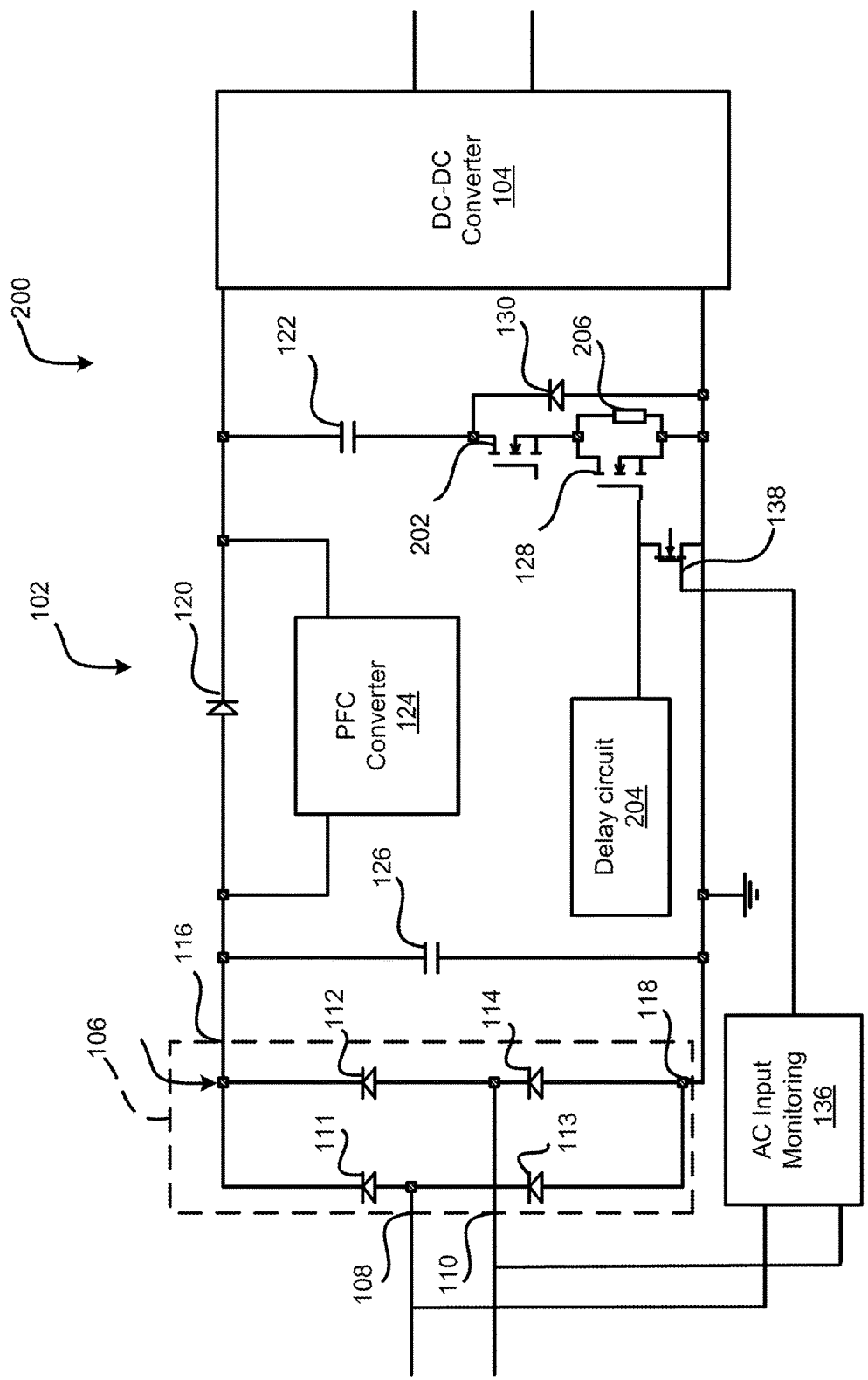
FIG. 2 is a schematic diagram of another embodiment of the power supply unit according to an embodiment of the present disclosure.

FIG. 2 illustrates another embodiment of a power supply unit 200 according to an embodiment of the present disclosure. In this implementation, power supply unit 200 includes a transistor 202, a delay circuit 204, and a resistor 206. The power supply unit also includes all of the components from FIG. 1 except for the virtual miller capacitor circuit 132 and the current source 134. The transistor 202 includes first and second current electrodes, and a gate electrode. In an embodiment, the transistor 202 can be an N-channel MOSFET, where the first current electrode is a drain electrode and the second current electrode is a source electrode. In some embodiments, transistor 202 may be a 500V-600V N-channel power MOSFET. However, other suitable power MOSFETs, or other types of transistors, such as an IGBT, or the like, having other ratings may also be used for the transistor 202. For example, transistor 202 may include a power transistor packaged in one of a variety of discrete SMT packages such as DPAK, D2PAK, or D3PAK, among others. The first current electrode of the transistor 202 is coupled to a second terminal of the capacitor 122, and the second current electrode of transistor 202 is coupled to the first current electrode of transistor 128.

The resistor 206 is connected in parallel with the transistor 128. In some embodiments, resistor 206 may include a resistor packaged in a two-terminal SMT package such as one of 01005, 0201, 0402, 0603, 0805, 1008, 1226, 1210, 1806, 1812, 2010, 2512, and 2920. While a few examples of resistor packages having a particular footprint have been given, these examples are not meant to be limiting in any way, and those skilled in the art will understand that other resistor packages having a variety of footprints may equally be used without departing from the scope of the present disclosure. In an embodiment, the resistor 206 can set an inrush current value for the power supply 200. That is, a value of the resistor 206 is selected so as to achieve a desired inrush current value. In an embodiment, the value of the resistor 206, together with the transistor 202, such as current-voltage characteristics of transistor 202, determine the inrush current value. In an embodiment, a value of the resistor 206 can be 5 Ohms. However, any of a variety of resistor values may be chosen to tune the inrush current value in accordance with a particular technology capability and/or application need. In an embodiment, a fast recovery diode 130, having a rating of about 500V-600V, can be connected anti-parallel to transistors 202 and 128. In this embodiment, the diode 130 can reduce the voltage spike caused by diode recovery.

The delay circuit 204 coupled to the gate electrode of the transistor 128. In an embodiment, the delay circuit 204 can include a resistor and a capacitor. In an embodiment, after coupling the inrush current limiting circuit 102 to a power source, charging of the gate electrode of transistor 128, and thus turn-on of transistor 128, is delayed in accordance with an RC delay time associated with the resistor and capacitor of the delay circuit 204. For example, values of resistor and capacitor can be chosen such that transistor 128 turns-on after capacitor 122 is fully charged, such as by the inrush current flowing through capacitor 122, transistor 202, and resistor 206. In an embodiment, values of the resistor and capacitor of the delay circuit 204 can be chosen such that transistor 128 turns-on in about 200-400 ms. For example, a value of the resistor can be about 100 kOhms, and the value of capacitor can be about 10 µF.

After transistor 128 is turned-on, the inrush current limiting circuit 102 is configured to short-circuit resistor 206 such that the current flowing through the capacitor 122 at steady-state is at low impedance. In an embodiment, turning-on transistor 128 can ensure a low impedance path in series with capacitor 122 during steady-state. Thus, the inrush current limiting circuit 102 provides a constant charge/inrush current to capacitor 122, thereby improving lifetime of various circuit components, such as capacitors, rectifiers, fuses, breakers, or the like. Moreover, embodiments described herein, which utilize small form-factor power MOSFETS, allow for the removal of bulky components, such as power resistors, NTC resistors, relays, or the like, used in conventional inrush current limiting circuits. Moreover, by using SMT MOSFETs for transistors 122 and 128 instead of power resistors, NTC resistors, and relays, and by using the PCB as a heatsink, the heat/loss of the inrush current limiting circuit 102 is well-managed, such as described in U.S. Pat. No. 9,513,681. The AC input monitoring circuit 136, in FIG. 2, can operate as described above with respect to FIG. 1.

Figure 3:
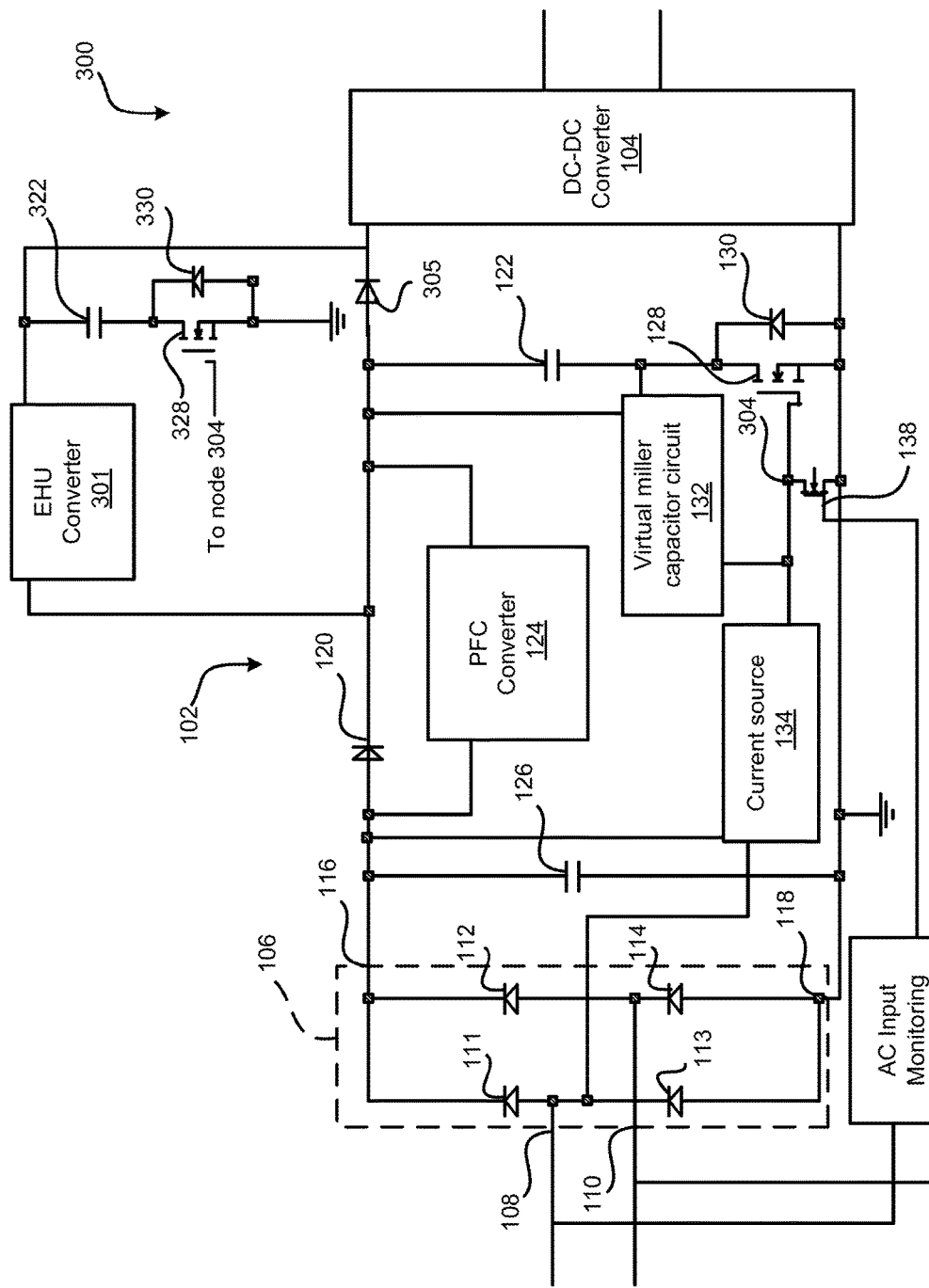
FIG. 3 is a schematic diagram of another embodiment of the power supply unit according to an embodiment of the present disclosure.

FIG. 3 illustrates another embodiment of a power supply unit 300 according to an embodiment of the present disclosure. In this implementation, power supply unit 300 includes an extended hold-up (EHU) converter 301, a diode 305, a second bulk capacitor 322, a second active transistor 328, and a diode 330 along with all of the components from the power supply unit 100 of FIG. 1. The EHU converter includes a first terminal coupled to the second terminal of the diode 120, and a second terminal. The capacitor 322 includes a first terminal coupled to the second terminal of the EHU converter 301, and a second terminal. The diode 305 includes a first terminal coupled to the second terminal of the diode 120, and a second terminal coupled to the DC-DC converter 104. The transistor 328 includes a first current electrode coupled to the second terminal of the capacitor 322, and a second current electrode. The transistor 328 also includes a gate electrode coupled to node 304, which in turn is coupled to the first current electrode of the transistor 138, a terminal of the virtual miller capacitor circuit 132, and a terminal of the current source 134. The diode 330 includes a first terminal coupled to the first current electrode of the transistor 328, and a second terminal coupled to the second current electrode of the transistor 328. In this configuration, the virtual miller capacitor circuit 132, and current source 134, and the AC input monitoring circuit 136 control the transistor 128 and limit the in-rush and re-rush currents within the power supply unit 300.

In operation, at beginning of a power on or reset event, there is no charge across capacitors 122 and 322, and the transistors 128 and 328 are held in an OFF state by the AC input monitoring circuit 136, so no current flows through capacitor 122, transistor 128, capacitor 322, or transistor 328. In an embodiment, the AC input monitoring circuit 136 can hold the transistors 128 and 328 in the OFF state by activating the transistor 138, which in turn can pull the voltage level of respective the gate electrodes to the ground terminal. Once the AC input monitoring circuit 136 releases the holding of transistors 128 and 328 in the OFF state by, for example, deactivating the transistor 138, then current source 134 can start to charge the gate electrodes of the transistors 128 and 328 via the node 304, and once the gate electrodes reach a gate threshold, the transistors 128 and 328 can both enter into the conduction region and current starts to flow through capacitor 122 and transistor 128 and through capacitor 322 and transistor 328.

The AC inrush current due to the power on event increases to a value which is proportional to the current provided by current source 134 and inversely proportional to the value of a capacitor in the virtual miller capacitor circuit 132. At a preset value, all current from current source 134 is diverted to the capacitor of the virtual miller capacitor circuit 132 and the gate electrodes of the transistors 128 and 328 are not charged anymore. Thus, keeping transistors 128 and 328 operating in a plateau region. As a result, the inrush current is maintained at a pre-set level, such as 3.5 A, as long as the value of the DC bus is greater than the voltage across capacitors 122 and 322.

The AC input monitoring circuit 136 also monitors the AC input voltage after the power supply 300 has completed the start-up phase. If the AC input monitoring circuit 136 detects an AC dropout, such as a brown out event or the AC input voltage dropping to zero, the AC input monitoring circuit 136 can provide an OFF state signal to activate the transistor 138, which in turn pulls the gate electrodes of the transistors 128 and 328 to zero to place the transistors 128 and 328 in an OFF state. The AC input monitoring circuit 136 can continue to monitor the AC input voltage. In response to the AC input voltage being re-applied to the input terminals 108 and 110, the AC input monitoring circuit 136 can provide an ON state signal to cause the transistor 138 to open, such that the current source 134 and the virtual miller capacitor circuit 132 can operate as described above to provide an adaptive gate voltage to the gate terminals of the transistors 128 and 328, which in turn limits a re-rush current in the power supply unit 300.

Figure 4:
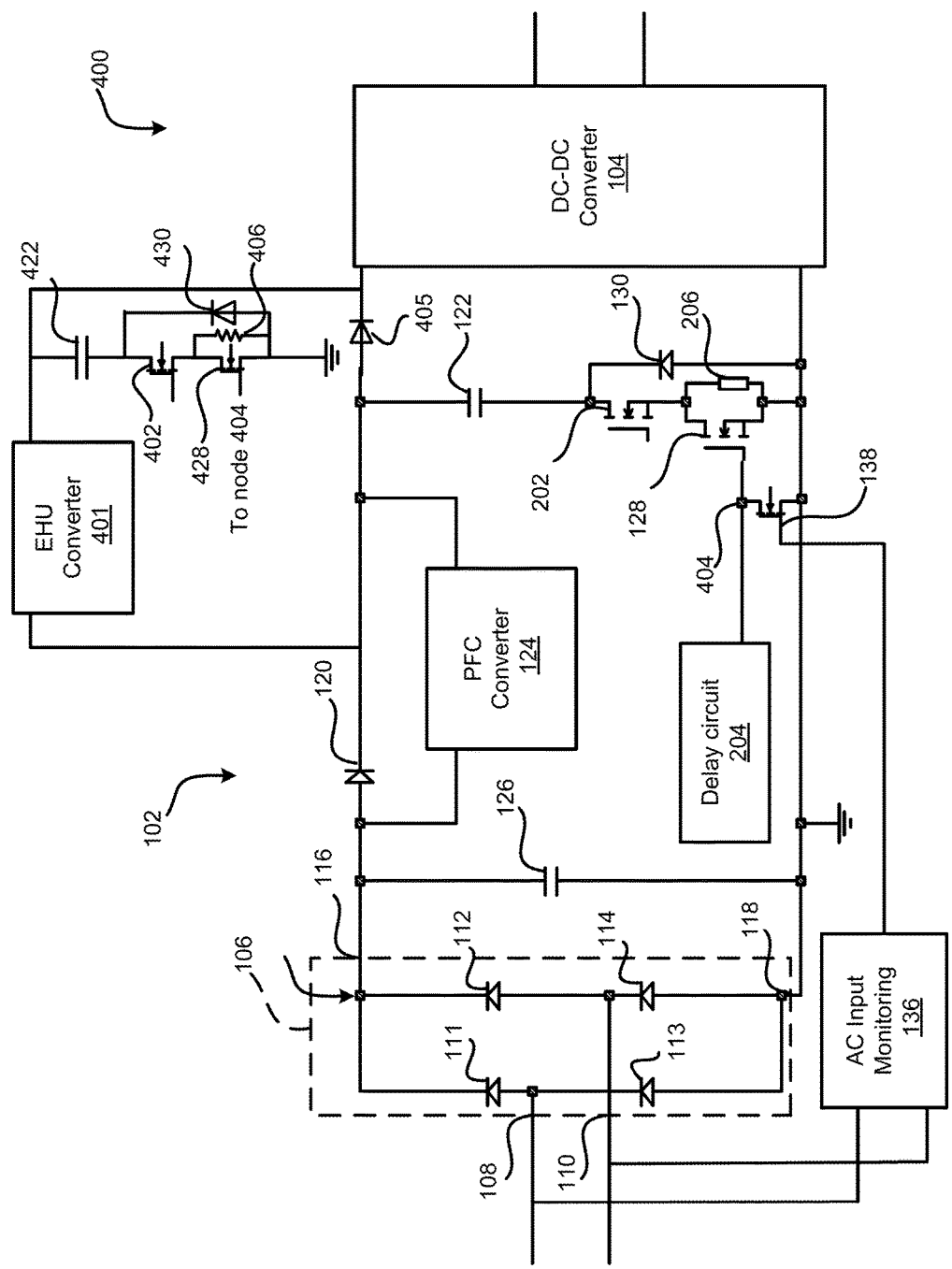
FIG. 4 is a schematic diagram of another embodiment of the power supply unit according to an embodiment of the present disclosure.

FIG. 4 illustrates another embodiment of a power supply unit 400 according to an embodiment of the present disclosure. In this implementation, power supply unit 400 includes an EHU converter 401, a transistor 402, a diode 405, a resistor 406, a second bulk capacitor 422, a second active transistor 428, and a diode 430 along with all of the components from the power supply unit 200 of FIG. 2. The EHU converter 401 includes a first terminal coupled to the second terminal of the diode 120, and a second terminal. The capacitor 422 includes a first terminal coupled to the second terminal of the EHU converter 401, and a second terminal. The transistor 402 includes a first current electrode coupled to the second terminal of the capacitor 422, a second current electrode, and a gate electrode. The diode 405 includes a first terminal coupled to the second terminal of the diode 120, and a second terminal coupled to the DC-DC converter 104. The transistor 428 includes a first current electrode coupled to the second current electrode of the transistor 402, and a second current electrode. The transistor 428 also includes a gate electrode coupled to node 404, which in turn is coupled to the first current electrode of the transistor 138, and to the terminal of the delay circuit 204. The resistor 406 is connected in parallel with the transistor 428, such that a first terminal of the resistor 406 is coupled to the first current electrode of the transistor 428, and a second terminal of the resistor 406 is coupled to the second current electrode of the transistor 428. The diode 430 includes a first terminal coupled to the first current electrode of the transistor 402, and a second terminal coupled to the second current electrode of the transistor 428. In this configuration, the delay circuit 204 and the AC input monitoring circuit 136 limit the in-rush and re-rush currents within the power supply unit 400 by controlling the current through the capacitor 422 and the transistors 402 and 428, and the current through the capacitor 122 and the transistors 202 and 128 as described above with respect to the capacitor 122 and the transistors 202 and 128 in FIG. 2.

Figure 5:
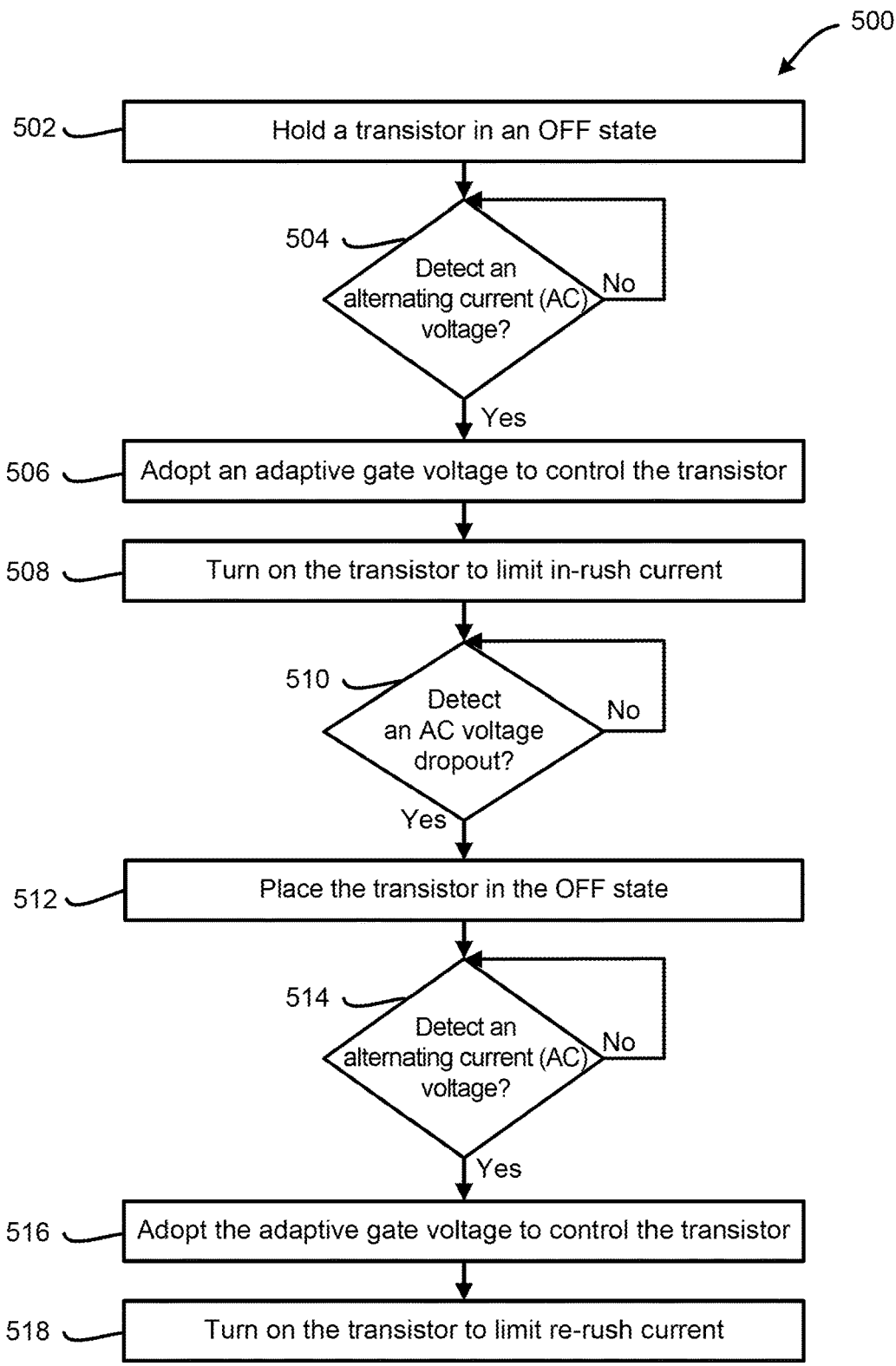
FIG. 5 is a flow diagram of a method for limiting a re-rush current in the power supply unit according to an embodiment of the present disclosure.

FIG. 5 shows a method for limiting a re-rush current in the power supply unit according to an embodiment of the present disclosure. At block 502, a transistor is held in an OFF state. In an embodiment, the transistor can be connected in series with a bulk capacitor of the power supply unit. In an embodiment, the AC input monitoring circuit can hold the transistor in the OFF state by provided an OFF signal to a switch, and the OFF signal can cause the switch to close and pull a gate electrode of the transistor to ground. At block 504, a determination is made whether an alternating current (AC) voltage is detected. In an embodiment, the AC voltage can be applied when the power supply unit is powered on. In an embodiment, an AC input monitoring circuit can detect whether the AC voltage is present.

If the AC voltage is detected, an adaptive gate voltage to control the transistor is adopted at block 506. In an embodiment, a current source can provide the adaptive gate voltage to a gate electrode of the transistor. The transistor is turned on to limit an in-rush current during the power on of the power supply at block 508. At block 510, a determination is made whether an AC voltage dropout is detected. In an embodiment, the AC voltage dropout can be a brown-out event, a complete power loss to the power supply unit, or the like. If the AC voltage dropout is detected, the transistor is placed in the OFF state at block 512. At block 514, a determination is made whether the AC voltage is detected after the AC voltage dropout. If the AC voltage is detected, the adaptive gate voltage to control the transistor is adopted as block 516. The transistor is turned on to limit a re-rush current AC dropout in the power supply at block 518. In an embodiment, if the power supply unit includes a second bulk capacitor and a second transistor in series with the second bulk capacitor, blocks 502-518 can be implemented with respect to the second transistor at substantially the same time as they are being implemented for the first transistor.

Figure 6:
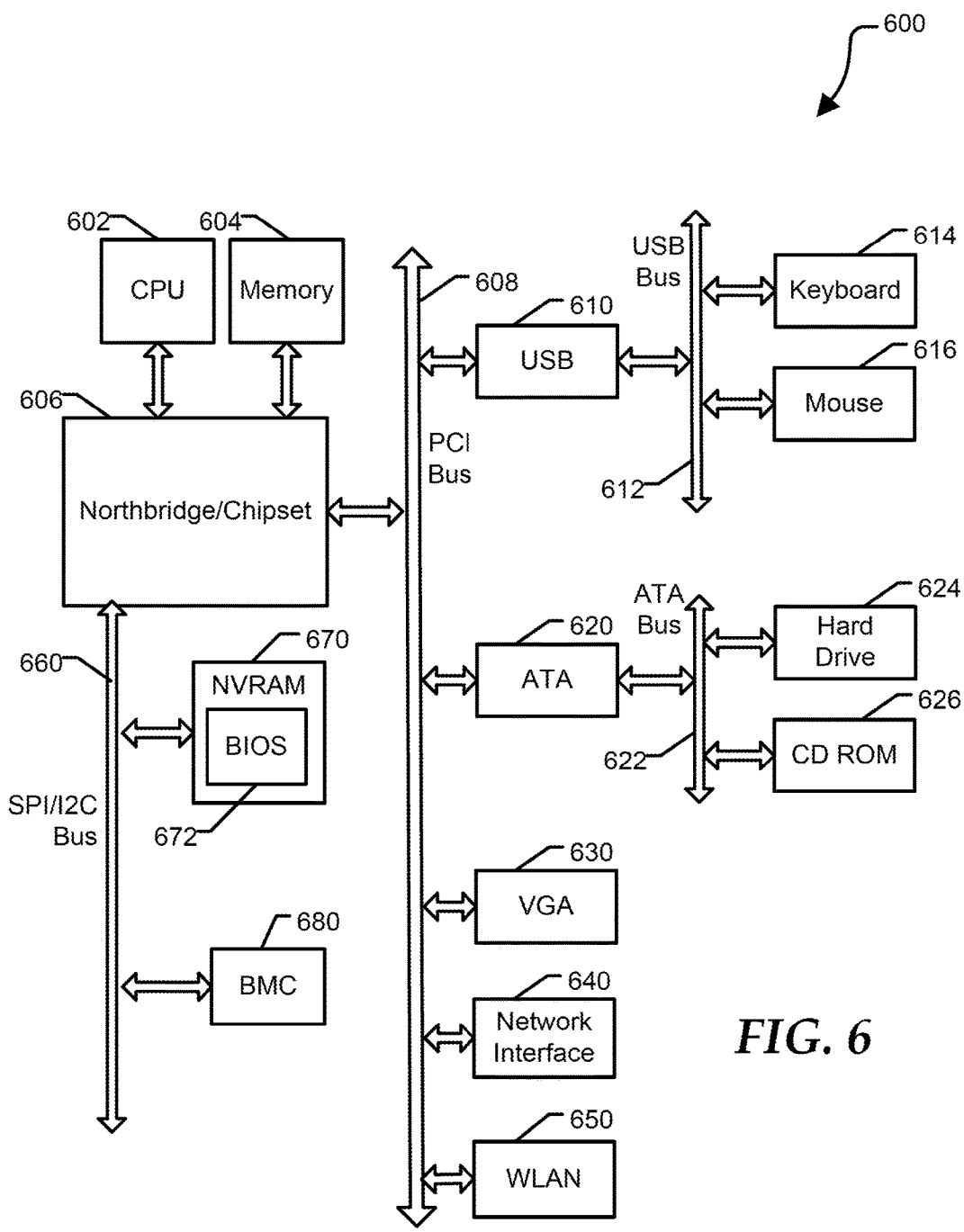
FIG. 6 is a block diagram of a general information handling system according to an embodiment of the present disclosure.

FIG. 6 illustrates a general information handling system 600 including a processor 602, a memory 604, a northbridge/chipset 606, a PCI bus 608, a universal serial bus (USB) controller 610, a USB 612, a keyboard device controller 614, a mouse device controller 616, a configuration an ATA bus controller 620, an ATA bus 622, a hard drive device controller 624, a compact disk read only memory (CD ROM) device controller 626, a video graphics array (VGA) device controller 630, a network interface controller (NIC) 640, a wireless local area network (WLAN) controller 650, a serial peripheral interface (SPI) bus 660, a NVRAM 670 for storing BIOS 672, and a baseboard management controller (BMC) 680. BMC 680 can be referred to as a service processor or embedded controller (EC). Capabilities and functions provided by BMC 680 can vary considerably based on the type of information handling system. For example, the term baseboard management system is often used to describe an embedded processor included at a server, while an embedded controller is more likely to be found in a consumer-level device. As disclosed herein, BMC 680 represents a processing device different from CPU 602, which provides various management functions for information handling system 600. For example, an embedded controller may be responsible for power management, cooling management, and the like. An embedded controller included at a data storage system can be referred to as a storage enclosure processor.

For purpose of this disclosure information system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 600 can include processing resources for executing machine-executable code, such as CPU 602, a programmable logic array (PLA), an embedded device such as a System-on-a-Chip (SoC), or other control logic hardware. Information handling system 600 can also include one or more computer-readable medium for storing machine-executable code, such as software or data.

System 600 can include additional processors that are configured to provide localized or specific control functions, such as a battery management controller. Bus 660 can include one or more busses, including a SPI bus, an I2C bus, a system management bus (SMBUS), a power management bus (PMBUS), and the like. BMC 680 can be configured to provide out-of-band access to devices at information handling system 600. As used herein, out-of-band access herein refers to operations performed prior to execution of BIOS 672 by processor 602 to initialize operation of system 600.

BIOS 672 can be referred to as a firmware image, and the term BIOS is herein used interchangeably with the term firmware image, or simply firmware. BIOS 672 includes instructions executable by CPU 602 to initialize and test the hardware components of system 600, and to load a boot loader or an operating system (OS) from a mass storage device. BIOS 672 additionally provides an abstraction layer for the hardware, such as a consistent way for application programs and operating systems to interact with the keyboard, display, and other input/output devices. When power is first applied to information handling system 600, the system begins a sequence of initialization procedures. During the initialization sequence, also referred to as a boot sequence, components of system 600 are configured and enabled for operation, and device drivers can be installed. Device drivers provide an interface through which other components of the system 600 can communicate with a corresponding device.

Information handling system 600 can include additional components and additional busses, not shown for clarity. For example, system 600 can include multiple processor cores, audio devices, and the like. While a particular arrangement of bus technologies and interconnections is illustrated for the purpose of example, one of skill will appreciate that the techniques disclosed herein are applicable to other system architectures. System 600 can include multiple CPUs and redundant bus controllers. One or more components can be integrated together. For example, portions of northbridge/chipset 606 can be integrated within CPU 602. Additional components of information handling system 600 can include one or more storage devices that can store machine-executable code, one or more communications ports for communicating with external devices, and various input and output (I/O) devices, such as a keyboard, a mouse, and a video display. An example of information handling system 600 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 600 can include a set of instructions that can be executed to cause the information handling system to perform any one or more of the methods or computer based functions disclosed herein. The information handling system 600 may operate as a standalone device or may be connected to other computer systems or peripheral devices, such as by a network.

In a networked deployment, the information handling system 600 may operate in the capacity of a server or as a client user computer in a server-client user network environment, or as a peer computer system in a peer-to-peer (or distributed) network environment. The information handling system 600 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 600 can be implemented using electronic devices that provide voice, video or data communication. Further, while a single information handling system 600 is illustrated, the term "system" shall also be taken to include any collection of systems or sub-systems that individually or jointly execute a set, or multiple sets, of instructions to perform one or more computer functions.

The information handling system 600 can include a disk drive unit and may include a computer-readable medium, not shown in FIG. 6, in which one or more sets of instructions, such as software, can be embedded. Further, the instructions may embody one or more of the methods or logic as described herein. In a particular embodiment, the instructions may reside completely, or at least partially, within system memory 604 or another memory included at system 600, and/or within the processor 602 during execution by the information handling system 600. The system memory 604 and the processor 602 also may include computer-readable media.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
   detecting, by an alternating current (AC) input monitoring circuit, an AC voltage dropout;
   placing, by the AC input monitoring circuit, a first transistor in an OFF state in response to detecting the AC voltage dropout, wherein the first transistor is connected in series with a first bulk capacitor of a power supply unit;
   detecting that the AC voltage is re-applied;
   adopting, by a current source, an adaptive gate voltage to control the first transistor in response to the re-applied AC voltage, wherein the adaptive gate voltage includes diversion of a gate current when the first transistor reaches a plateau region;
   providing the diverted gate current to a virtual miller capacitor to set a re-rush current through the first transistor at a constant value; and
   turning on the first transistor based on the adaptive gate voltage to keep the first transistor operating in the plateau region.

2. The method of claim 1, wherein placing the first transistor in the OFF state comprises:
   providing an OFF signal to a second transistor;
   activating the second transistor in response to the OFF signal; and
   pulling a voltage level of a gate electrode of the first transistor to a ground voltage level in response to the second transistor being activated.

3. The method of claim 1, further comprising:
   placing, by the AC input monitoring circuit, a second transistor in the OFF state in response to detected the AC voltage dropout, wherein the second transistor is connected in series with a second bulk capacitor of the power supply unit;
   detecting that the AC voltage is re-applied;
   adopting the adaptive gate voltage to control the second transistor in response to the AC voltage being re-applied; and
   turning on the second transistor based on the adaptive gate voltage to limit a re-rush current within the power supply unit after the AC voltage is re-applied.

4. The method of claim 1, wherein the AC voltage dropout is a brown-out event in the power supply unit.

5. The method of claim 1, wherein the gate current is diverted to a virtual miller capacitance circuit that is coupled to the first transistor.

6. The method of claim 1, wherein turning on the first transistor further comprises:
   delaying the turn on of the first transistor based on a delay time of a delay circuit.

7. A power supply unit comprising:
   a rectifying module to rectify an alternating current (AC) voltage;

a first bulk capacitor to receive the rectified AC voltage from the rectifying module;

a first transistor coupled in series with the first bulk capacitor;

an AC input monitoring circuit coupled to the first transistor, the AC input monitoring circuit to hold the first transistor in an OFF state when the AC voltage is in a dropout state;

a current source coupled to the first transistor, the current source to adopt an adaptive gate voltage to control the first transistor in response to a detection of the AC voltage being re-applied, wherein the adaptive gate voltage includes diversion of a gate current when the first transistor reaches a plateau region to limit a re-rush current; and a virtual miller capacitance circuit coupled to the first transistor, the virtual miller capacitance circuit to set the re-rush current through the first transistor at a constant value.

8. The power supply unit of claim 7, wherein no current flows through the first bulk capacitor and the first transistor in response to the first transistor being held in the OFF state.

9. The power supply unit of claim 7, further comprising:
a second transistor coupled to the first transistor, wherein the AC input monitoring circuit holds the first transistors in the OFF state in response to activating the second transistor.

10. The power supply unit of claim 9, wherein when the second transistor is activated, a voltage level on a gate electrode of the first transistor is pulled to a ground level.

11. The power supply unit of claim 7, wherein the gate current is diverted to a virtual miller capacitance circuit that is coupled to the first transistor.

12. The power supply unit of claim 7, further comprising:
a delay circuit coupled to the first transistor, wherein the delay circuit delays the turn on of the first transistor based on a delay time of the delay circuit.

13. The power supply unit of claim 7, further comprising:
a second bulk capacitor; and
a second transistor coupled in series with the second bulk capacitor, wherein the AC input monitoring circuit to hold the second transistor in the OFF state in response to the detection of the AC voltage dropout, the current source to adopt the adaptive gate voltage to control the second bulk transistor in response to the detection of the AC voltage being re-applied, and to turn on the second transistor based on the adaptive gate voltage to limit the re-rush current within the power supply unit after the AC voltage is re-applied.

14. A power supply unit comprising:
a first bulk capacitor to receive a rectified alternating current (AC) voltage from a rectifying module;

a first transistor coupled in series with the first bulk capacitor;

an AC input monitoring circuit coupled to the first transistor, the AC input monitoring circuit to hold the first transistor in an OFF state in response to a detection of an AC voltage dropout;

a current source coupled to the first transistor, the current source to adopt an adaptive gate voltage to control the first transistor in response to a detection of the AC voltage being re-applied, and to turn on the first transistor based on the adaptive gate voltage to limit a re-rush current within the power supply unit after the AC voltage is re-applied; and a virtual miller capacitance circuit coupled to the first transistor, the virtual miller capacitance circuit to set the re-rush current through the first transistor at a constant value.

15. The power supply unit of claim 14 wherein no current flows through the first bulk capacitor and the first transistor in response to the first transistor being held in the OFF state.

16. The power supply unit of claim 14, further comprising:
a second transistor coupled to the first transistor, wherein the AC input monitoring circuit holds the first transistors in the OFF state in response to activating the second transistor.

17. The power supply unit of claim 16, wherein when the second transistor is activated, a voltage level on a gate electrode of the first transistor is pulled to a ground voltage level.

18. The power supply unit of claim 14, wherein the AC voltage dropout is a complete power loss to the power supply unit.

19. The power supply unit of claim 14, further comprising:
a delay circuit coupled to the first transistor, wherein the delay circuit delays the turn on of the first transistor based on a delay time of the delay circuit.

20. The power supply unit of claim 14, further comprising:
a second bulk capacitor; and
a second transistor coupled in series with the second bulk capacitor, wherein the AC input monitoring circuit to hold the second transistor in the OFF state in response to detecting the AC voltage dropout, the current source to adopt the adaptive gate voltage to control the second bulk transistor in response to the detection of the AC voltage being re-applied, and to turn on the second transistor based on the adaptive gate voltage to limit the re-rush current within the power supply unit after the AC voltage is re-applied.

* * * * *